(12) United States Patent
Lin

(10) Patent No.: US 6,882,408 B2
(45) Date of Patent: Apr. 19, 2005

(54) RETICLE TRANSFERRING SUPPORT AND TRANSFERRING METHOD THEREOF

(75) Inventor: Po-Ching Lin, Hsin-Chu (TW)

(73) Assignee: Powerchip Semiconductor Corp., Hsin-Chu (TW)

(*) Notice: Subject to any disclaimer, the term of this patent is extended or adjusted under 35 U.S.C. 154(b) by 0 days.

(21) Appl. No.: 10/604,092

(22) Filed: Jun. 25, 2003

(65) Prior Publication Data

US 2004/0263822 A1 Dec. 30, 2004

(51) Int. Cl.⁷ ............................................... G03B 27/42
(52) U.S. Cl. ........................... 355/72; 355/75; 206/456; 206/710; 206/724
(58) Field of Search ............................. 355/53, 72, 75; 206/454, 710, 724; 430/5, 20

(56) References Cited

U.S. PATENT DOCUMENTS

| 5,314,068 A | * | 5/1994 | Nakazato et al. ............ 206/454 |
| 5,375,710 A | * | 12/1994 | Hayakawa et al. ......... 206/724 |
| 6,216,873 B1 | * | 4/2001 | Fosnight et al. ............ 206/710 |

* cited by examiner

*Primary Examiner*—D. Rutledge
(74) *Attorney, Agent, or Firm*—Winston Hsu

(57) ABSTRACT

A reticle transferring support. The reticle transferring support has a supporting basefor containing a reticle, a plurality of braces for supporting the reticle, and a plurality of holders for fixing the position of the reticle. The braces are spheroids composed of soft plastic, and the position of the braces is adjustable so that the reticle will not be arranged. The holders each have an inclined plane so that the position of the reticle will be fixed automatically.

16 Claims, 6 Drawing Sheets

RETICLE TRANSFERRING SUPPORT AND TRANSFERRING METHOD THEREOF

BACKGROUND OF INVENTION

1. Field of the Invention

The present invention provides a reticle transferring support for containing a reticle, and more particularly to a reticle transferring support that can avoid damaging the reticle.

2. Description of the Prior Art

Photolithography is an important step in the entire processes of semiconductor production. Characteristics associated with MOS transistors, such as film pattern or dopant region, are determined by this step. Photolithography basically proceeds by covering a layer of photo-sensitive material on a semiconductor, and casting a parallel light beam, through a reticle, onto the photosensitive material. Since the reticle has patterns of a circuit layout, the photo-sensitive material incurs a selective photo reaction so that the pattern on the reticle will be transferred to the semiconductor wafer.

In general, the reticle comprises a smooth and transparent plate of glass or quartz as its foundation, and a layer of chromium film of 1000 Å thick over the surface of the reticle. Therefor the pattern on the reticle is very fragile.

Please refer to FIG. 1 and FIG. 2. FIG. 1 is a top view of a reticle transferring support of a SMIF pod in the prior art. FIG. 2 is a cross-section diagram of a reticle transferring support of a SMIF pod in the prior art. As shown in FIG. 1, the reticle transferring support 10 comprises a supporting base 12 having four rectangular braces 14 for supporting a reticle 16. For conforming to the semiconductor and material international (SEMI) standard, both sides of the reticle transferring support have to keep a gap of 0.95 mm for the convenience of reticle load/unload. However, it is not easy to fix the position of the reticle when the operator places the reticle 16 with a reticle clip into the reticle transferring support 10. Particularly, if the position of the reticle 16 deviates too much, errors could happen in the following vacuum adsorption operation.

Therefore the operator needs to adjust the reticle 16 to proper position. However, it is not easy to adjust the position of the reticle 16 manually, besides, damages of the reticle 16 are often caused by friction during the reticle adjusting action. As shown in FIG. 2, the braces 14 of the reticle transferring support 10 have a rectangular structure, thus the contact area between the reticle 16 and the braces 14 is wide, which makes it easy to damage a bar code area (not shown) and a vacuum adsorption area (not shown) of the reticle 16.

Please refer to FIG. 3. FIG. 3 is a flow chart of a reticle transferring procedure according to the prior art. As shown in FIG. 3, the reticle transferring procedure comprises following steps: Step 30: start; Step utilize an opener to open a SMIF pod; Step 34: utilize a reticle clip to place a reticle into a reticle transferring support of the SMIF pod; Step 36: adjust the position of the reticle; Step 38: utilize the opener to close the SMIF pod; and Step 40: end.

In the reticle transferring procedure of the prior art, first an opener as Asyst ALU opener) is employed to open a SMIF pod. Then a reticle is manually placed in a reticle transferring support of the SMIF pod by a reticle clip, and adjusted to proper position. Finally, the SMIF pod is closed by the opener. As mentioned above, the reticle transferring support 10 of the SMIF pod has to keep a gap of 0.95 mm on both sides for conforming to the SEMI standard, and moreover the contact area between the reticle 16 and the rectangular braces 14 is too wide, thus the back surface of the reticle 16 is easily damaged. For this reason, a reticle transferring support that can avoid damaging the reticle is eagerly required.

SUMMARY OF INVENTION

It is therefore a primary objective of the claimed invention to provide a reticle transferring support to solve the reticle damage and position deviation problems of the prior art reticle transferring support.

According to the claimed invention, a reticle transferring support that can fix the position reticle and avoid reticle damages is provided. The reticle transferring support can further work in coordination with a reticle stocker to load a reticle into a SMIF (standard mechanical interface) pod, such that the reticle damages and other problems caused by humans will be avoided. The reticle transferring support of the present invention comprises a supporting base for containing a reticle, a plurality of braces for supporting the reticle, and a plurality of holders fixing the reticle position. It is worth noticing that the inner part of the holders is an inclined plane or a curved surface, such that the reticle can be effectively fixed.

It is an advantage of the claimed invention that the inner part of the holders is inclined, thus the reticle is automatically fixed as long as the reticle is placed in the reticle transferring support. Moreover, the operator does not need to adjust the reticle position, so the reticle will not be damaged by friction. In addition, the reticle transferring support of the present invention can further work in coordination with a robot arm of a reticle stocker to load the reticle into a SMIF pod.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
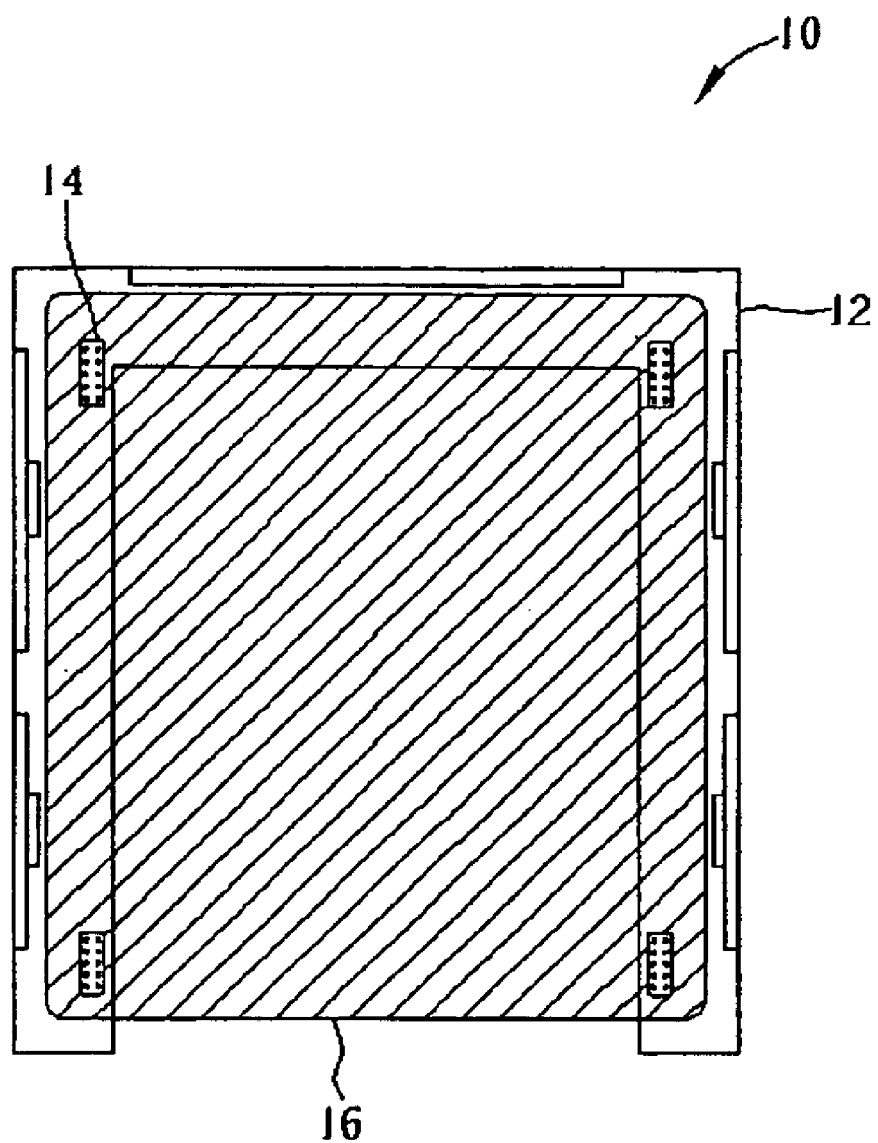
FIG. 1 is a top view of a reticle transferring support of a SMIF pod in the prior art.
Figure 2:
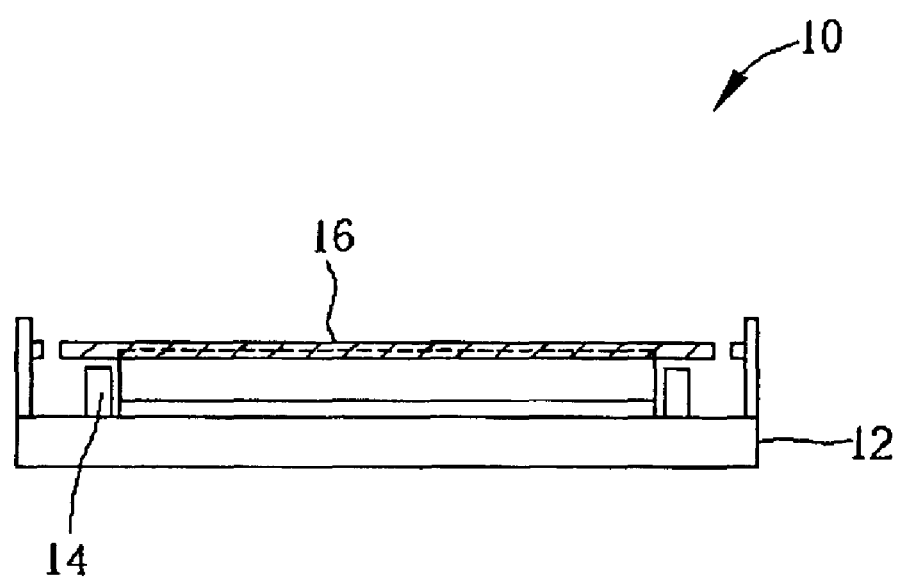
FIG. 2 is a cross-section diagram of a reticle transferring support of a SMIF pod in the prior art.
Figure 3:
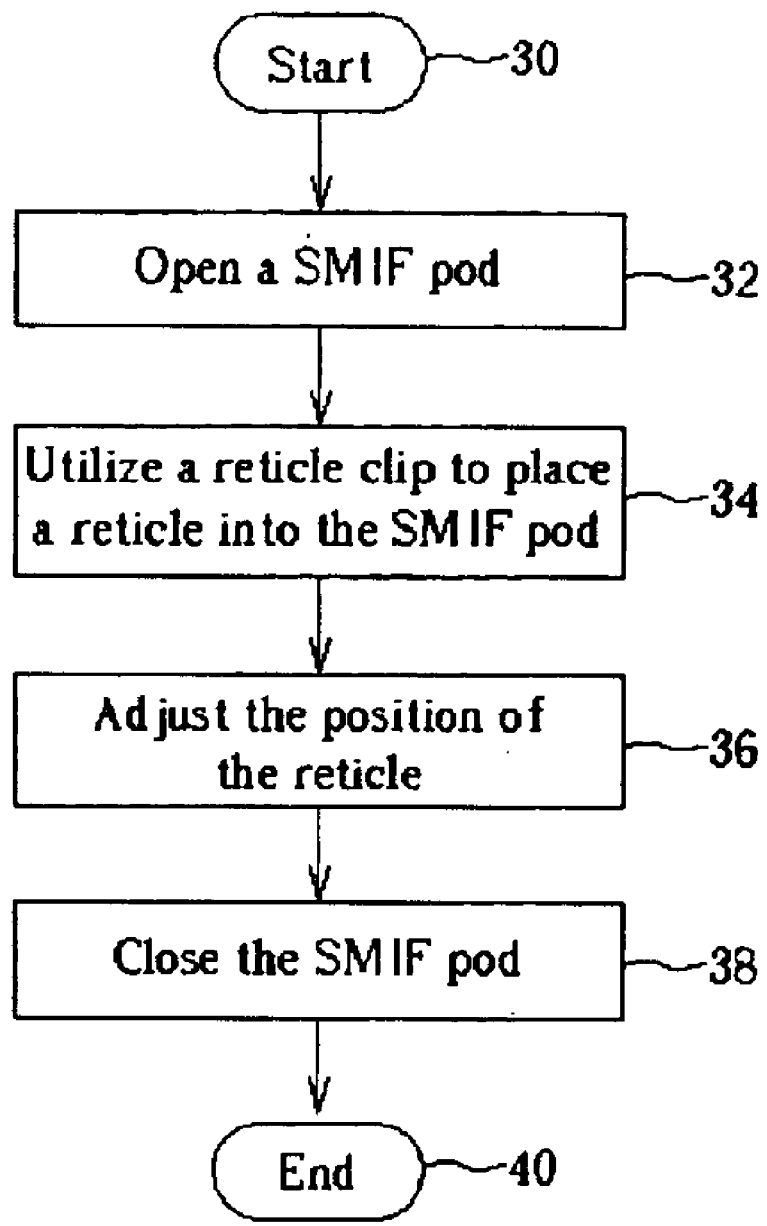
FIG. 3 is a flow chart of a reticle transferring procedure according to the prior art.
Figure 4:
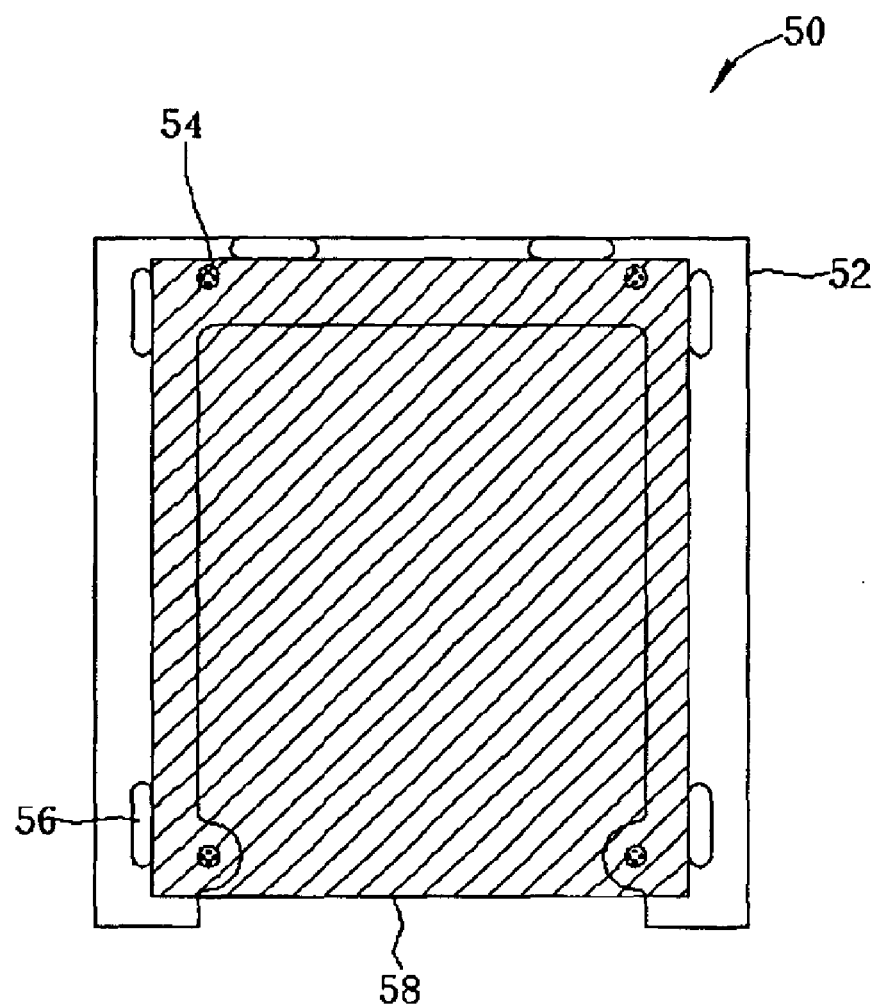
FIG. 4 is a top view of a reticle transferring support of the present invention.
Figure 5:
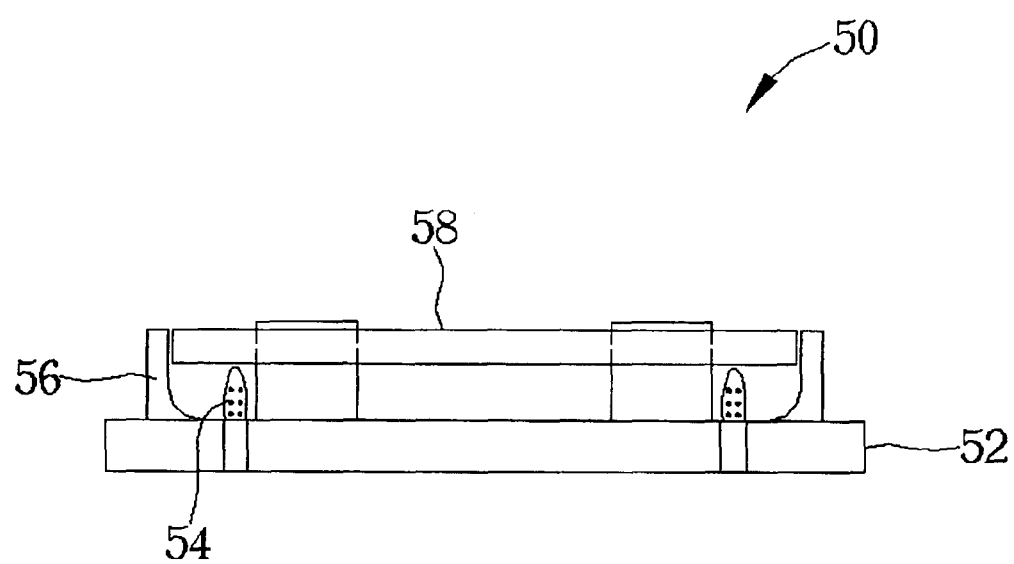
FIG. 5 is a cross-section diagram of a reticle transferring support of the present invention.

Please refer to FIG. 4 and FIG. 5. FIG. 4 a top view of a reticle transferring support of the present invention, and FIG. 5 is a cross-section diagram of a reticle transferring support of the present invention. As shown in FIG. 4 and FIG. 5, the reticle transferring support 50 of the present invention comprises a supporting base 52 for containing a reticle 58, a plurality of braces 54 for supporting the reticle 58, and a plurality of holders 56 for fixing the reticle position. It is worth noticing that the braces 54 installed on the supporting base 52 are spheroidic structures such that the contact area between the reticle 58 and the braces 54 is smaller. In addition, the braces 54 are adjustable to prevent from damaging a bar code area (not shown) and a vacuum adsorption area (not shown). The braces 54 include a soft material, such as plastic or other flexible materials, to avoid scraping the reticle 58. In addition, because the inner part of the holders 56 is an inclined plane or a curved surface, the holders 56 will automatically fix the reticle 58 to a proper position.

Figure 6:
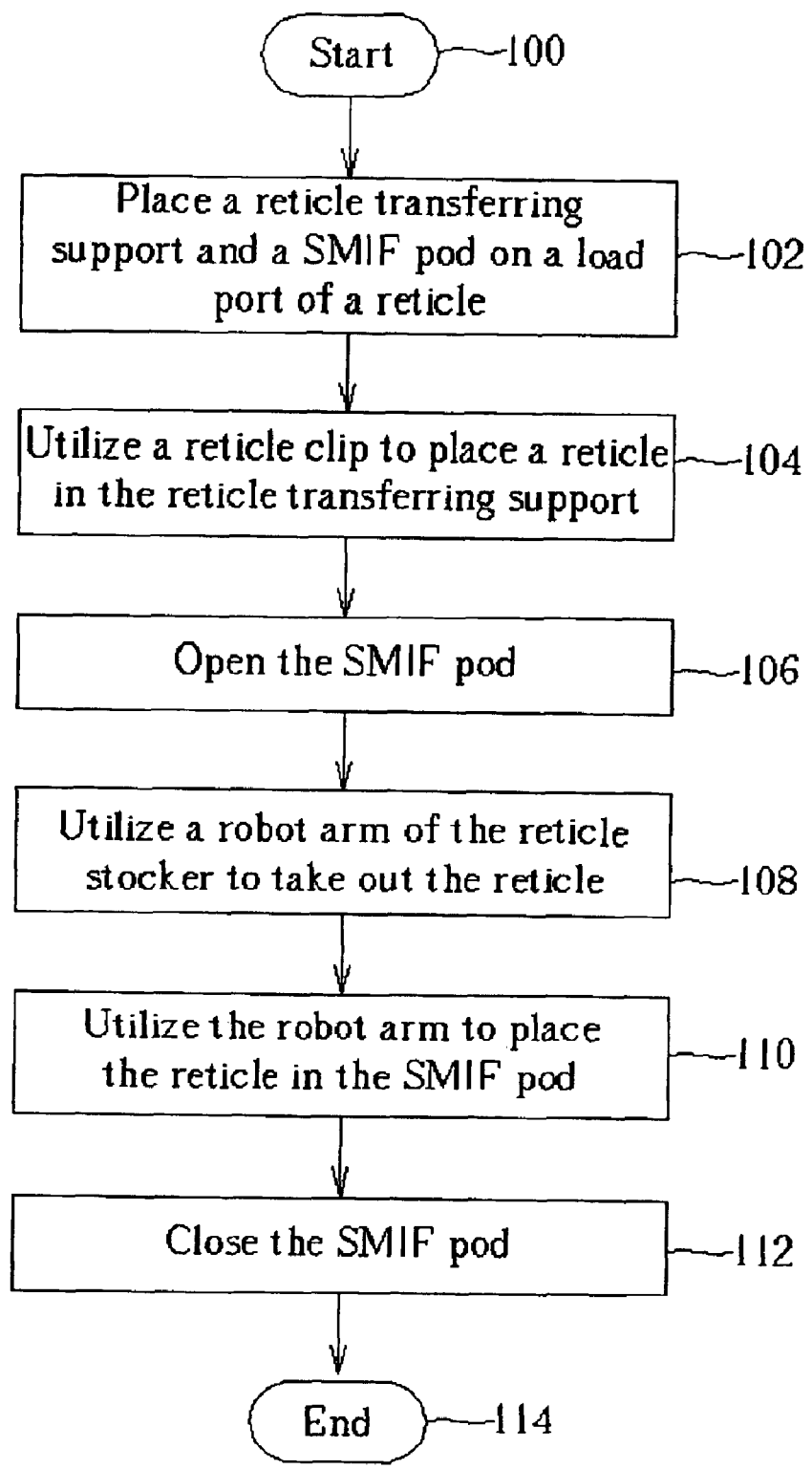
FIG. 6 is a flow chart of a reticle transferring procedure according to the present invention.

Please refer to FIG. 6. FIG. 6 is a flow chart of a reticle transferring procedure according to the present invention. As shown in FIG. 6, the reticle transferring procedure includes following steps:

Step 100: start;

Step 102: place a reticle transferring support and a SMIF pod on a load port of a reticle stocker;

Step 104: utilize a reticle clip to place a reticle in the reticle transferring support;

Step 106: open the SMIF pod;

Step 108: utilize a robot arm of the reticle stocker to take out the reticle;

Step 110: utilize the robot arm to place the reticle in the SMIF pod;

Step 112: close the SMIF pod; and

Step 114: end.

In the reticle transferring procedure according to the present invention, a reticle transferring support is employed in coordination with a reticle stocker to accomplish the reticle transferring operation. In the above-mentioned reticle transferring procedure, first the reticle transferring support and the SMIF pod are placed on the load port of the reticle stocker. It is worth noticing that the original function of the reticle stocker is to stock the reticle, the reticle stocker is used to carry the reticle in the present invention since the reticle stocker has a robot arm. Then the reticle is placed in the reticle transferring support of the present invention by manually using a reticle clip. As long as the reticle is placed in the reticle transferring support, the reticle will be automatically fixed because of the inclined-plane design of the holders. Furthermore, the braces are plastic spheroidic structure such that the reticle will not be scraped or damaged. Finally, the SMIF pod is opened by an opener, the reticle is carried from the reticle transferring support to the SMIF pod by the robot arm, and the SMIF pod is closed by the opener.

According to the reticle transferring procedure of the prior art, the reticle is directly placed in the SMIF pod by manually using a reticle clip. The operator needs to adjust the reticle to proper position. However, the reticle is easily damaged or scraped by friction during the adjusting action.

In contrast with the prior art, the present invention utilizes a reticle transferring support as a transferring interface. The inclined-plane design of the holders allows the reticle to be fixed automatically, and the soft spheroidic structure of the braces prevents the reticle from being damaged when the reticle is placed in the reticle transferring support. Afterward, the reticle can be precisely placed in the SMIF pod with the robot arm of the reticle stocker.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A reticle transferring support comprising:

a supporting base;

a plurality of braces installed on the supporting base for supporting a reticle, the braces being spheroidic structures such that contact areas of the reticle and the braces are reduced; and a plurality of holders installed on the fringe of the supporting base for fixing the reticle;

wherein an inner part of the holders automatically align the reticle to prevent horizontal shifting.

2. The reticle transferring support of claim 1 wherein the inner part of the holders is an inclined plane.

3. The reticle transferring support of claim 1 wherein the inner part of the holders is a curved surface.

4. The reticle transferring support of claim 1 wherein the material of the braces includes plastic.

5. The reticle transferring support of claim 1 wherein the braces are at the corners of the supporting base, and their positions are adjustable so as to avoid contacting a bar code area and a vacuum adsorption area of the reticle.

6. The reticle transferring support of claim 1 wherein the reticle transferring support is installed on a load port of a reticle stocker, and the reticle stocker comprises a robot arm to carry the reticle from the reticle transferring support to a SMIF pod.

7. A reticle transferring method comprising:

placing a reticle transferring support and a SMIF (standard mechanical interface) pod on a load port of a reticle stocker;

utilizing a reticle clip to place a reticle into the reticle transferring support;

utilizing a robot arm installed in the reticle stocker to carry the reticle from the reticle transferring support; and utilizing the robot arm to place reticle into the SMIF pod.

8. The method of claim 7 wherein the reticle transferring support includes:

a supporting base;

a plurality of braces installed on the supporting base for supporting the reticle; and a plurality of holders installed on the fringe of the supporting base for fixing the reticle.

9. The method of claim 7 further comprising steps of utilizing the reticle stocker to open and to close the SMIF pod.

10. The method of claim 7 further comprising a step of utilizing the robot arm to carry the reticle from the SMIF pod back to the retile transferring support.

11. A reticle transferring support comprising:

a supporting base;

a plurality of braces installed at corners of the supporting base for supporting a reticle, and positions of the braces being adjustable; and a plurality of holders installed on the fringe of the supporting base for fixing the reticle;

wherein an inner part of the holders automatically align the reticle to prevent horizontal shifting.

12. The reticle transferring support of claim 11 wherein the inner part of the holders is an inclined plane.

13. The reticle transferring a support of claim 11 wherein the inner part of the holders is a curved surface.

14. The reticle transferring support of claim 11 wherein the braces are spheroidic structures such that the contact area of the reticle and the braces is reduced.

15. The reticle transferring support of claim 11 wherein the material of the brace includes plastic.

16. The reticle transferring support of claim 11 wherein the reticle transferring support is installed on a load port of a reticle stocker, and the reticle stocker comprises a robot arm to carry the reticle from the reticle transferring support to the SMIF pod.

* * * * *